(12) United States Patent
Perzlmaier et al.

(10) Patent No.: US 10,283,686 B2
(45) Date of Patent: May 7, 2019

(54) OPTOELECTRONIC SEMICONDUCTOR COMPONENT, OPTOELECTRONIC ARRANGEMENT AND METHOD OF PRODUCING AN OPTOELECTRONIC SEMICONDUCTOR COMPONENT

(71) Applicant: OSRAM Opto Semiconductors GmbH, Regensburg (DE)

(72) Inventors: Korbinian Perzlmaier, Regensburg (DE); Anna Kasprzak-Zablocka, Donaustauf (DE); Stefanie Rammelsberger, Zeltlarn (DE); Julian Ikonomov, Neutraubling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/544,288

(22) PCT Filed: Jan. 11, 2016

(86) PCT No.: PCT/EP2016/050386
§ 371 (c)(1),
(2) Date: Jul. 18, 2017

(87) PCT Pub. No.: WO2016/120047
PCT Pub. Date: Aug. 4, 2016

(65) Prior Publication Data
US 2018/0013043 A1  Jan. 11, 2018

(30) Foreign Application Priority Data
Jan. 26, 2015 (DE) .......... 10 2015 101 070

(51) Int. Cl.
*H01L 31/02* (2006.01)
*H01L 33/48* (2010.01)
(Continued)

(52) U.S. Cl.
CPC .......... *H01L 33/62* (2013.01); *H01L 31/0203* (2013.01); *H01L 31/02005* (2013.01);
(Continued)

(58) Field of Classification Search
CPC ... H01L 33/62; H01L 33/486; H01L 31/0203; H01L 31/02005; H01L 2933/0066
See application file for complete search history.

(56) References Cited

U.S. PATENT DOCUMENTS

2009/0085052 A1* 4/2009 Ko .......... H01L 33/32
257/98
2009/0218588 A1 9/2009 Panaccione et al.
(Continued)

FOREIGN PATENT DOCUMENTS

DE 10 2012 215 524 A1 3/2014
JP 2013-243254 A 12/2013
WO 2014/097644 A1 6/2014

*Primary Examiner* — Steven H Loke
*Assistant Examiner* — Juanita B Rhodes
(74) *Attorney, Agent, or Firm* — DLA Piper LLP (US)

(57) ABSTRACT

An optoelectronic semiconductor component includes an optoelectronic semiconductor chip; and an electrical connection point that contacts the optoelectronic semiconductor chip, wherein the electrical connection point covers the optoelectronic semiconductor chip on the bottom thereof at least in some areas, the electrical connection point includes a contact layer facing toward the optoelectronic semiconductor chip, the electrical connection point includes at least one barrier layer arranged on a side of the contact layer facing away from the optoelectronic semiconductor chip, the electrical connection point includes a protective layer arranged on the side of the at least one barrier layer facing away from the contact layer, the layers of the electrical connection point are arranged one on top of another along a (Continued)

stack direction, and the stack direction runs perpendicular to a main extension plane of the optoelectronic semiconductor chip.

13 Claims, 1 Drawing Sheet

(51) Int. Cl.
*H01L 33/62* (2010.01)
*H01L 31/0203* (2014.01)
*H01L 33/40* (2010.01)

(52) U.S. Cl.
CPC ............ *H01L 33/40* (2013.01); *H01L 33/486* (2013.01); *H01L 2933/0066* (2013.01)

(56) References Cited

U.S. PATENT DOCUMENTS

| | | | |
|---|---|---|---|
| 2010/0117111 A1* | 5/2010 | Illek | H01L 33/382 |
| | | | 257/98 |
| 2012/0104450 A1 | 5/2012 | Chen et al. | |
| 2013/0302979 A1 | 11/2013 | Yu et al. | |
| 2014/0231849 A1* | 8/2014 | Song | H01L 33/405 |
| | | | 257/98 |
| 2015/0206819 A1 | 7/2015 | Ichiryu et al. | |

\* cited by examiner

OPTOELECTRONIC SEMICONDUCTOR COMPONENT, OPTOELECTRONIC ARRANGEMENT AND METHOD OF PRODUCING AN OPTOELECTRONIC SEMICONDUCTOR COMPONENT

TECHNICAL FIELD

This disclosure relates to an optoelectronic semiconductor component, an optoelectronic arrangement and a method of producing an optoelectronic semiconductor component.

BACKGROUND

It could be helpful to provide an optoelectronic semiconductor component that can be produced particularly inexpensively as well as an optoelectronic semiconductor component distinguished by increased reliability during operation.

SUMMARY

We provide an optoelectronic semiconductor component including an optoelectronic semiconductor chip and an electrical connection point that contacts the optoelectronic semiconductor chip, wherein the electrical connection point covers the optoelectronic semiconductor chip on the bottom thereof at least in some areas, the electrical connection point includes a contact layer facing toward the optoelectronic semiconductor chip, the electrical connection point includes at least one barrier layer arranged on a side of the contact layer facing away from the optoelectronic semiconductor chip, the electrical connection point includes a protective layer arranged on the side of the at least one barrier layer facing away from the contact layer, the layers of the electrical connection point are arranged one on top of another along a stack direction, and the stack direction runs perpendicular to a main extension plane of the optoelectronic semiconductor chip.

We also provide an optoelectronic arrangement including a connection carrier, and at least one optoelectronic semiconductor component including an optoelectronic semiconductor chip and an electrical connection point that contacts the optoelectronic semiconductor chip, wherein the electrical connection point covers the optoelectronic semiconductor chip on the bottom thereof at least in some areas, the electrical connection point includes a contact layer facing toward the optoelectronic semiconductor chip, the electrical connection point includes at least one barrier layer arranged on a side of the contact layer facing away from the optoelectronic semiconductor chip, the electrical connection point includes a protective layer arranged on the side of the at least one barrier layer facing away from the contact layer, the layers of the electrical connection point are arranged one on top of another along a stack direction, and the stack direction runs perpendicular to a main extension plane of the optoelectronic semiconductor chip, wherein between the connection carrier and the optoelectronic semiconductor component a connecting material is arranged, and the connecting material is in direct contact with the protective layer.

We further provide a method of producing an optoelectronic semiconductor component including an optoelectronic semiconductor chip and an electrical connection point that contacts the optoelectronic semiconductor chip, wherein the electrical connection point covers the optoelectronic semiconductor chip on the bottom thereof at least in some areas, the electrical connection point includes a contact layer facing toward the optoelectronic semiconductor chip, the electrical connection point includes at least one barrier layer arranged on a side of the contact layer facing away from the optoelectronic semiconductor chip, the electrical connection point includes a protective layer arranged on the side of the at least one barrier layer facing away from the contact layer, the layers of the electrical connection point are arranged one on top of another along a stack direction, and the stack direction runs perpendicular to a main extension plane of the optoelectronic semiconductor chip, including producing the electrical connection point exclusively by physical vapor deposition.

We further yet provide an optoelectronic semiconductor component including an optoelectronic semiconductor chip and an electrical connection point that contacts the optoelectronic semiconductor chip, wherein the electrical connection point covers the optoelectronic semiconductor chip on the bottom thereof at least in some areas, the electrical connection point includes a contact layer facing towards the optoelectronic semiconductor chip, the electrical connection point includes at least one barrier layer arranged on a side of the contact layer facing away from the optoelectronic semiconductor chip, the electrical connection point includes a protective layer arranged on the side of the at least one barrier layer facing away from the contact layer, the layers of the electrical connection point are arranged one on top of another along a stack direction, the stack direction runs perpendicular to a main extension plane of the optoelectronic semiconductor chip, the electrical connection point includes two or more pairs of the barrier layer and an intermediate layer that border one another directly and are arranged between the contact layer and the protective layer stacked one on top of another, and the stack of pairs of the barrier layer and the intermediate layer is compressively strained.

LIST OF REFERENCE NUMBERS

Figure 1:
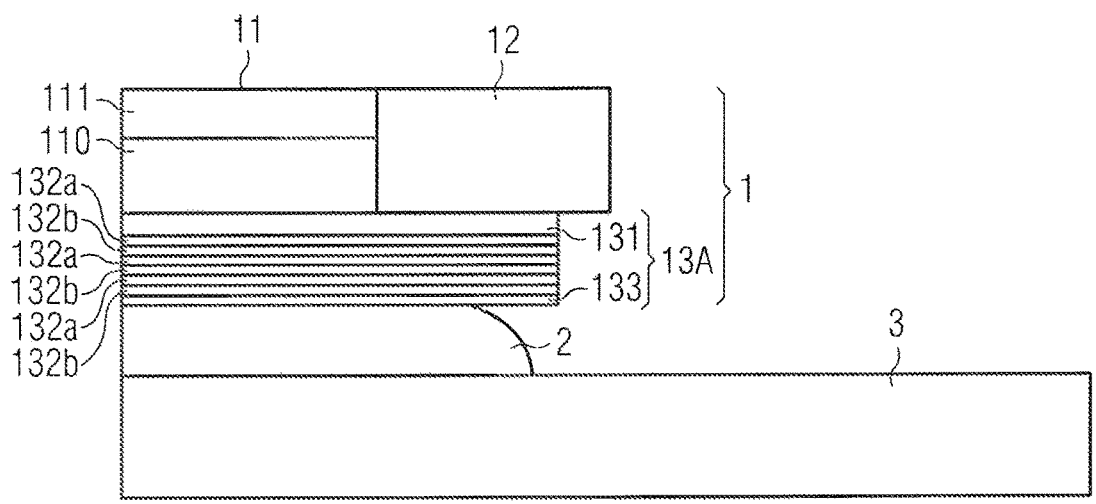
FIGS. 1 and 2 show optoelectronic semiconductor components and optoelectronic arrangements in examples thereof in sectional diagrams.

1 Optoelectronic semiconductor component
2 Connecting material
3 Connection carrier
11 Optoelectronic semiconductor chip
12 Molded body
13A Connection point
13B Further connection point
14 Via
15 Contact element
110 Chip carrier
111 Epitaxial layers
131 Contact layer
132*a* Barrier layers
132*b* Intermediate layer
133 Protective layer

DETAILED DESCRIPTION

We provide an optoelectronic semiconductor component. The optoelectronic semiconductor component is, e.g. a radiation-emitting or radiation-detecting semiconductor component. For example, the optoelectronic semiconductor component can be an LED or a photodiode. In particular, it is possible that the optoelectronic semiconductor component is a so-called "semiconductor chip in a frame" component. A component of this type is described, e.g. in DE 10 2012 215 524 A1, the relevant disclosure of which is incorporated herein by reference. In particular, a "semiconductor chip in a frame" component has a molded body that can be formed using, e.g. a silicone resin and/or an epoxy resin.

The optoelectronic semiconductor component may comprise at least one optoelectronic semiconductor chip. The optoelectronic semiconductor chip is, e.g. an LED chip or a photodiode chip. In other words, the optoelectronic semiconductor chip is intended to generate or detect electromagnetic radiation, e.g. light, during operation. The optoelectronic semiconductor chip can comprise a carrier, e.g. a growth substrate or a carrier body different from a growth substrate. Furthermore, the optoelectronic semiconductor chip can contain epitaxially grown layers comprising at least one active zone in which, during operation of the optoelectronic semiconductor chip, the electromagnetic radiation to be generated is generated or the electromagnetic radiation to be detected is detected. Between the carrier body and the epitaxially grown layers, a reflective layer can be arranged, which is formed using a reflective material such as Al or Ag.

Furthermore, it is possible that the optoelectronic semiconductor component comprises multiple optoelectronic semiconductor chips that may be of different types. For example, the optoelectronic semiconductor component can also comprise optoelectronic semiconductor chips that generate electromagnetic radiation in different ranges of the spectrum during operation.

The optoelectronic semiconductor component may comprise at least one electrical connection point that contacts the optoelectronic semiconductor chip. The electrical connection point is located on an external side of the optoelectronic semiconductor component and can therefore be accessed and contacted from the exterior. The electrical connection point is formed using an electrically conductive material and electrically connects to the n-side or p-side of the associated optoelectronic semiconductor chip. During operation of the optoelectronic semiconductor chip, this is then contacted on the n- or p-side via the electrical connection point.

The electrical connection point may cover the optoelectronic semiconductor chip on the bottom thereof, at least in some areas. In other words, the electrical connection point can be in direct contact with a constituent of the optoelectronic semiconductor chip, e.g. with the carrier of the semiconductor chip or the epitaxial layers of the semiconductor chip. The electrical connection point can be in the form of a layer covering the optoelectronic semiconductor chip on the bottom thereof at least in some areas. For example, the electrical connection point covers at least 10% of the base surface of the optoelectronic semiconductor chip on the bottom thereof, in particular at least 25% of the base surface. It is also possible that the electrical connection point covers the optoelectronic semiconductor chip completely on the bottom thereof. The supply of current into the semiconductor chip via the electrical connection point may be particularly uniform, i.e. the optoelectronic semiconductor chip is supplied with current particularly uniformly over its surface and dissipation of heat generated during operation of the optoelectronic semiconductor chip can take place particularly efficiently via the electrical connection point.

The electrical connection point may comprise a contact layer facing towards the optoelectronic semiconductor chip. The contact layer is selected such that it adheres particularly well to the optoelectronic semiconductor chip. Furthermore, it is selected such that it remains chemically and mechanically stable even at elevated temperatures such as those occurring, e.g. during a soldering process so that no liquefaction of the contact layer takes place and no solids diffusion processes of material of the contact layer into the optoelectronic semiconductor chip take place within the limits of manufacturing tolerance.

If the contact layer borders, e.g. a constituent of the optoelectronic semiconductor chip formed using silicon or germanium or contains at least one of these materials, aluminum proves particularly advantageous in forming the contact layer. In other words, the contact layer can then in particular contain or consist of aluminum. Preferably, the contact layer is free from platinum and/or Au.

The contact layer can, moreover, be formed to be reflective for electromagnetic radiation to be generated or detected in the optoelectronic semiconductor chip, and so the optical efficiency of the optoelectronic semiconductor component can also be increased as a result of the contact layer.

The electrical connection point may comprise at least one barrier layer arranged on a side of the contact layer facing away from the optoelectronic semiconductor chip. The barrier layer is formed from materials selected such that they substantially react only to form an adhesive bond with the adjacent layers, for example, the contact layer, and otherwise no chemical reaction occurs, in particular with the materials of the optoelectronic semiconductor chip. The barrier layer is formed, e.g. using the following materials, i.e. it can consist of at least one of the materials or can contain at least one of the materials: Ti, W, TiW, TiN, TiWN, WN.

The electrical connection point can comprise multiple barrier layers that can be formed using the same or different materials. Between the barrier layers, intermediate layers can be introduced that are formed using another material, which can prevent continuous defects in the stack of barrier layers so that the stack of barrier layers is particularly impervious.

The at least one barrier layer here is selected such that it does not undergo, or barely undergoes, any chemical reactions with a connecting material, with which the optoelectronic semiconductor component is affixed and electrically contacted to its intended location and inhibits or prevents diffusion of connecting material in the optoelectronic semiconductor chip.

The electrical connection point may comprise a protective layer arranged on the side of the at least one barrier layer facing away from the contact layer. The protective layer is a terminating layer that outwardly terminates the electrical connection point on its side facing away from the optoelectronic semiconductor chip. In other words, the protective layer forms an external surface of the electrical connection point at least in some areas. The protective layer thus acts as a connecting layer to a connecting material with which the optoelectronic semiconductor component is affixed and electrically connected at its intended location.

The protective layer is selected in terms of its material such that it reacts with an adjacent layer of the electrical connection point so that a particularly good adhesive bond is formed therewith and it is stable against degradation processes. This facilitates the storage of the optoelectronic semiconductor component before it is affixed at its intended location. For this purpose, for example, the protective layer can be formed using gold or can consist of gold. However, the reaction of the protective layer with an adjacent layer does not lead to material of the adjacent layer being able to diffuse through the protective layer. In particular, there is no such penetration of the protective layer by the material of adjacent layers before the optoelectronic semiconductor component is affixed at its intended location.

The optoelectronic semiconductor component may comprise an optoelectronic semiconductor chip and a first connection point that contacts the optoelectronic semiconductor chip, wherein the electrical connection point covers the optoelectronic semiconductor chip on the bottom thereof at least in some areas, the electrical connection point comprises a contact layer facing toward the optoelectronic semiconductor chip, the electrical connection point comprises at least one barrier layer arranged on a side of the contact layer facing away from the optoelectronic semiconductor chip, and the electrical connection point comprises a protective layer arranged on the side of the at least one barrier layer facing away from the contact layer.

The optoelectronic semiconductor component is based inter alia on the consideration that, for the further processing of optoelectronic semiconductor components, SMT (surface mount technology) processes are often employed in which the optoelectronic semiconductor component is heated to temperatures of 250° C. and more, e.g. for a soldering process, in particular a reflow soldering process. For processes of this type, it is advantageous if a reliable separation of the connecting means, e.g. a solder paste, from the optoelectronic semiconductor chip takes place. The optoelectronic semiconductor component is now based inter alia on the idea that, for this separation, it is possible to use the electrical connection point supplemented by appropriate functional layers.

Alternatively, instead of an electrical connection point, which comprises multiple functional layers, it is possible to use a thick, in particular a galvanically deposited, metal layer, e.g. of copper or nickel that reacts only slowly with the connecting material and, because of this slow reaction, even when the optoelectronic semiconductor component is heated multiple times in the context of soldering, the reaction front does not advance as far as the optoelectronic semiconductor chip. However, these thick metal layers having a thickness of, e.g. at least 5 µm, have the disadvantage that they greatly increase the height of the component and are, moreover, complicated and expensive to produce.

Surprisingly, we found that construction of the electrical connection point described as a layer stack with multiple functional layers makes a particularly thin electrical connection point possible, which reliably protects against diffusion processes during the connection of the optoelectronic semiconductor component at its intended location. In particular, an electrical connection point is also stable in a "resistance to soldering heat (RTSH) test," in which the optoelectronic semiconductor component is heated three times or more to temperatures of 250° C. or higher for periods of nine seconds or more. For example, the optoelectronic semiconductor component is heated three times to temperatures of 260° C. for ten seconds during such a test.

The electrical connection point is therefore formed in particular as a layer stack, wherein the layers of the electrical connection point are arranged one on top of another along a stack direction, wherein in particular the stack direction runs perpendicular to a main extension plane of the optoelectronic semiconductor chip. At least within the limits of manufacturing tolerance or in general, e.g. all the layers of the electrical connection point then run parallel to the main extension plane of the optoelectronic semiconductor chip completely, i.e. over the entire layer.

Furthermore, it is also possible that the electrical connection point largely or completely covers the semiconductor chip on the bottom thereof. The connection point in this case covers, e.g. at least 75% of the bottom of the semiconductor chip facing towards it. It is even possible that the connection point projects beyond the semiconductor chip and thus has a base surface equal to or greater than the area of the bottom of the semiconductor chip.

An optoelectronic semiconductor component is distinguished by material savings owing to the possibility of using a thinner electrical connection point and is therefore particularly inexpensive to produce. Furthermore, an electroplating step of producing the electrical connection point can be avoided, which simplifies the production process and also contributes to reducing costs. Furthermore, an electrical connection point as described here of an optoelectronic semiconductor component as described here ensures reliable connectability, in particular solderability, of the optoelectronic semiconductor component at the target location as a result of which the optoelectronic semiconductor component is particularly reliable during operation.

At least the barrier layers or the entire electrical connection point may be produced exclusively by physical vapor deposition. In other words, at least the barrier layers or preferably, however, all the layers of the electrical connection point are generated by physical vapor deposition. In this case, the layers can be produced by methods such as thermal evaporation, electron beam vapor deposition, pulsed laser deposition, arc evaporation, molecular beam epitaxy, sputtering, ion beam-assisted deposition, ion plating or the like. The electrical connection point is in particular free from galvanically generated layers.

The feature according to which the electrical connection point is produced at least partially or exclusively by physical vapor deposition is clearly detectable on the finished optoelectronic semiconductor component. This feature is therefore not a method feature, but a material feature that can be detected on the finished product by conventional analytical techniques of semiconductor technology. In other words, all the layers of the electrical connection point are PVD (physical vapor deposition) layers produced by physical vapor deposition.

An electrical connection point of this type can be produced particularly simply and inexpensively since no electroplating step is needed to produce the electrical connection point. Furthermore, the PVD layers of the electrical connection point can be formed particularly thinly, which makes a particularly thinly formed electrical connection point possible.

The optoelectronic semiconductor component may comprise a molded body formed using an electrically insulating material and surrounding the optoelectronic semiconductor chip at least in some areas, wherein the electrical connection point covers the molded body on the bottom thereof at least in some areas. The optoelectronic semiconductor chip is completely surrounded by the molded body laterally, for example. In other words, the optoelectronic semiconductor chip can border the molded body indirectly or directly in a lateral direction. The lateral directions are those directions that run parallel to a main extension plane of the optoelectronic semiconductor chip and/or of the semiconductor component. The lateral directions run perpendicular to a vertical direction, wherein the vertical direction runs, e.g. parallel or substantially parallel to the stack direction of the layers of the electrical connection point.

The molded body can comprise a matrix material formed using a plastic such as silicone, epoxy, or a silicone-epoxy hybrid material. Reflective and/or absorbent and/or scattering particles reflect, absorb or scatter any electromagnetic radiation that occurs, in particular light, and can be introduced into the matrix material. In this way, the molded body can be formed to be colored and/or reflective and/or absorbent.

The molded body can be flush or substantially flush with the optoelectronic semiconductor chip, at least on the bottom of the optoelectronic semiconductor chip facing towards the electrical connection point. Furthermore, it is possible that the optoelectronic semiconductor chip and the molded body are flush or substantially flush with one another on the top facing away from the bottom. Substantially flush means that the optoelectronic semiconductor chip projects beyond the molded body or the molded body projects beyond the optoelectronic semiconductor chip only in a height corresponding to no more than 15% of the thickness of the semiconductor chip in a vertical direction.

The electrical connection point can extend from the semiconductor chip to the molded body in lateral directions, at least in some areas so that it covers the molded body on the bottom thereof in some areas. It is possible that the electrical connection point extends without interruption from an area in which it covers the optoelectronic semiconductor chip to an area in which it covers the molded body. In the area of the optoelectronic semiconductor chip, the electrical connection point mechanically and electrically connects to the semiconductor chip and in the area of the molded body, the electrical connection point mechanically connects to the molded body.

In particular, an electrical connection point produced by a PVD method can extend into areas in which the molded body is located. In this way, the electrical connection point can be configured to have a particularly large surface area that allows a more reliable connection of the electrical connection point to the remaining constituents of the optoelectronic semiconductor component on the one hand and to the target location at which the optoelectronic semiconductor component is affixed and connected on the other hand. Furthermore, execution of the electrical connection point such that the molded body is also partially covered thereby can contribute to improved heat dissipation during operation of the optoelectronic semiconductor component.

In particular, the contact layer of the electrical connection point is selected such that it also exhibits particularly good adhesion to the material of the molded body. In this case, aluminum in particular proves to be a material that can be connected to the molded body with particularly good adhesion.

The electrical connection point may be partially in direct contact with the optoelectronic semiconductor chip and/or the molded body. As a result of the direct contact of the electrical connection point with the optoelectronic semiconductor chip and/or the molded body, which is facilitated in particular by the contact layer of the electrical connection point, the mechanical adhesion between the electrical connection point and the remaining constituents of the optoelectronic semiconductor component is increased.

In particular, it is possible that the electrical connection point is in direct contact with both the optoelectronic semiconductor chip and the molded body such that the contact layer directly borders both constituents and extends in lateral directions from the semiconductor chip to the molded body. In this case, it is in particular advantageous if the molded body and the optoelectronic semiconductor chip are flush or substantially flush with one another on the bottom of the optoelectronic semiconductor chip facing towards the electrical connection point.

The electrical connection point may have two, in particular three or more, pairs of the barrier layer and an intermediate layer that border one another directly and are arranged between the contact layer and the protective layer stacked one on top of another. In other words, the electrical connection point comprises at least three barrier layers that can be, e.g. identical in form. The side of each barrier layer facing away from the contact layer can be bordered by an intermediate layer formed using a material that differs from the material of the barrier layer. The multilayer construction of the barrier layers and intermediate layers as a stack enables continuous defects, e.g. at grain boundaries or growth boundaries of the layers or in the area between semiconductor chip and molded body, to be prevented owing to the fact that the barrier layer nucleates again at the intermediate layer in each case. For example, the intermediate layer can be formed using materials such as Pt, Ni, NiV or Au or can consist of one of these materials.

For example, the following layer constructions prove particularly advantageous for the electrical connection point, wherein the stated layer thickness of the layers is measured in a vertical direction and can vary by +/−20%, in particular by +/−10%, around the stated value:

1st Example:
contact layer composed of Al having a layer thickness of 100 nm to 200 nm;
N times*(barrier layer composed of Ti having a layer thickness of 80 nm and intermediate layer composed of Pt or Ni having a layer thickness of 30 nm), wherein N>1, in particular N=3 or N=5;
protective layer composed of Au having a layer thickness of 50 nm to 100 nm.

$2^{nd}$ Example:
contact layer composed of Al having a layer thickness of 100 nm to 200 nm;
N times * (barrier layer composed of TiWN having a layer thickness of 100 nm and intermediate layer composed of Pt having a layer thickness of 30 nm), wherein N>1, in particular N=3 or N=5;
protective layer composed of Au having a layer thickness of 50 nm to 100 nm.

The stated layers can border one another directly and the connection point can be free from any other layers not listed and can thus consist of the stated layers.

The stack of pairs of the barrier layer and intermediate layer and/or the entire electrical connection point may be compressively strained, in particular in lateral directions. This compressive strain can be achieved through selection of the materials and layer thicknesses and/or selection of the parameters of the deposition processes used to produce the layers as stated by way of example in the above examples. With such a compressively strained stack of pairs of the barrier layer and intermediate layer, tensile strain of the electrical connection point can be avoided. In the event of mechanical damage to the electrical connection point at one location, the defect caused thereby is to a certain extent pushed closed by the compressive strain or is at least unable to break open any further. As a result, a particularly good barrier quality of the stack of pairs of the barrier layer and intermediate layer against diffusion of connecting material, in particular soldering material, is achieved.

The electrical connection point may have a thickness of at least 250 nm and no more than 2000 nm. This is possible in particular through the fact that the electrical connection point is produced exclusively by a PVD method, i.e. all layers of the electrical connection points are PVD layers. This also applies to the intermediate layers that can be arranged in the stack of pairs of barrier layers and the intermediate layers.

The optoelectronic semiconductor component may comprise at least one further electrical connection point to contact the optoelectronic semiconductor chip, which is formed identically to the electrical connection point. For example, the further electrical connection point can also be in indirect or direct contact with the bottom of the associated optoelectronic semiconductor chip and optionally the molded body. In this case, the optoelectronic semiconductor chip is, e.g. a flip-chip that is already per se in surface-mountable form.

Alternatively, it is possible that the optoelectronic semiconductor component may have a via extending through the molded body in some areas and electrically connects to the optoelectronic semiconductor chip. The further electrical connection point can then cover the via at least in some areas or completely at the bottom thereof. Overall, the electrical connection point and the further electrical connection point are arranged at a distance from one another in lateral directions on the bottom of the optoelectronic semiconductor component so that the optoelectronic semiconductor component can be surface-mounted by the two electrical connection points.

The further electrical connection point can be in direct contact with the via and/or the molded body in some areas.

We further provide an optoelectronic arrangement. The optoelectronic arrangement comprises at least one optoelectronic semiconductor component. In other words, all features described for the optoelectronic semiconductor component are also described for the optoelectronic arrangement and vice versa. The optoelectronic arrangement further comprises a connection carrier that can be, e.g. a printed circuit board. The at least one optoelectronic semiconductor component is mechanically affixed and electrically connected to the at least one connection carrier, for which purpose a connecting material is arranged between the connection carrier and the optoelectronic semiconductor component, wherein the connecting material is in direct contact with the protective layer of the electrical connection point and optionally the further electrical connection point. The connecting material is, e.g. a soldering material such as, e.g. a solder paste.

An optoelectronic semiconductor component can connect to the printed circuit board, e.g. by a reflow soldering process to form the optoelectronic arrangement without any damage to the optoelectronic semiconductor chips occurring from the soldering material. This is possible in particular through the construction of the electrical connection point and optionally of the further electrical connection point.

We still further provide a method of producing an optoelectronic semiconductor component. By the method, an optoelectronic semiconductor component can be produced, and so all features disclosed for the optoelectronic semiconductor component are also disclosed for the method and vice versa.

In the method, at least the barrier layers or the entire electrical connection point of the optoelectronic semiconductor component may be produced exclusively by physical vapor deposition. In other words, all the layers of the electrical connection point such as, e.g. the contact layer, barrier layer, intermediate layer and protective layer, are produced by a PVD method. In this case, different PVD methods can be used to produce different layers. Particularly preferably, however, all the layers of the electrical connection point are produced by the same PVD method in the same facility. This allows particularly simple and thus inexpensive production of the electrical connection point.

The further electrical connection point may be produced exclusively by physical vapor deposition. The further electrical connection point can be produced in the same method steps and at the same time as the electrical connection point. This simplifies production of the optoelectronic semiconductor component overall.

Below, the optoelectronic semiconductor component, the optoelectronic arrangement and the method of producing an optoelectronic semiconductor component will be explained in more detail with the aid of examples and the associated figures.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements may be exaggerated.

FIG. 1 shows an example of an optoelectronic arrangement with an example of an optoelectronic semiconductor component 1 as a sectional illustration in an enlargement of part thereof.

The optoelectronic semiconductor component 1 comprises an optoelectronic semiconductor chip 11. The optoelectronic semiconductor chip 11 is, e.g. an LED chip. The optoelectronic semiconductor chip 11 comprises a chip carrier 110 and epitaxial layers 111. The chip carrier 110 is in an electrically conductive form. For example, the chip carrier 110 is not a growth substrate but a carrier body for the epitaxial layers 111, which has been connected to the epitaxial layers 111 before or after detachment of the growth substrate.

The carrier 110 is formed using, e.g. silicon or germanium.

The optoelectronic semiconductor chip is surrounded laterally in lateral directions by the molded body 12. The molded body 12 can be formed using, e.g. a plastic material as a matrix material filled with scattering or reflective particles so that the molded body 12 is reflective for electromagnetic radiation generated in the optoelectronic semiconductor chip 11.

At the bottom of the optoelectronic semiconductor chip 11 in the example of FIG. 1, the molded body 12 and the optoelectronic semiconductor chip 11 are flush with one another.

At the bottom of the optoelectronic semiconductor chip 11 and the molded body, the electrical connection point 13A extends. The electrical connection point 13A comprises a contact layer 131, a layer stack of barrier layers 132a and intermediate layers 132b and a protective layer 133 arranged on the bottom of the layer stack of barrier layers 132a and intermediate layers 132b facing away from the contact layer 131.

All the layers of the connection point 13A are generated using a PVD method. For example, the contact layer 131 is formed using aluminum and has a thickness of approximately 100 nm to 200 nm. The barrier layers 132a are each formed using Ti and the intermediate layers 132b are each formed using Pt. The barrier layers 132a have a thickness of, e.g. 80 nm and the intermediate layers 132b each have a thickness of 30 nm. At the bottom, the connection point 13A is terminated by the protective layer 13 formed using, e.g. gold and has a thickness of approximately 50 nm to 100 nm.

The optoelectronic semiconductor component formed in this way mechanically and electrically connects by the connecting material 2 formed using, e.g. a solder paste, to the connection carrier 3, which is, e.g. a printed circuit board.

In the example of FIG. 1, the electrical connection point 13A extends on the bottom of the semiconductor chip 11 to the molded body 12 and thus covers these two constituents of the optoelectronic semiconductor component 1.

Figure 2:
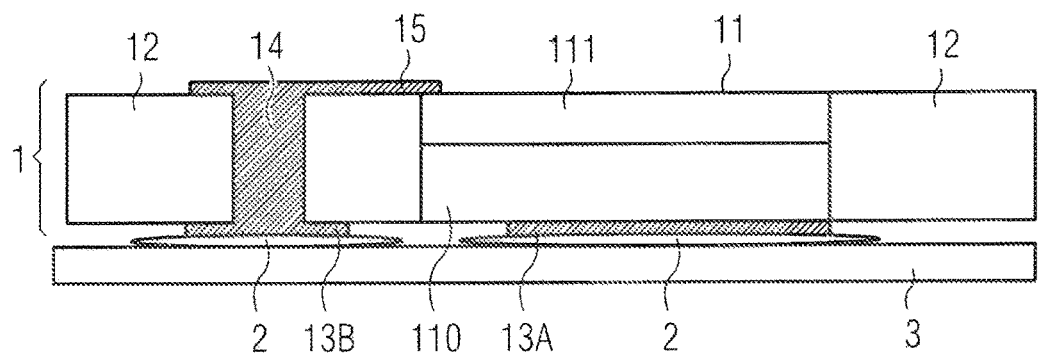

In conjunction with FIG. 2, a further example of an optoelectronic arrangement is described in more detail with an example of an optoelectronic semiconductor component 1.

The optoelectronic semiconductor component 1 in the example of FIG. 2 again shows an optoelectronic semiconductor chip 11 embedded laterally in a molded body 12. The via 14 formed using an electrically conductive material extends through the molded body 12 from the top thereof to the bottom thereof at a distance laterally from the semiconductor chip 11. The via 14 electrically connects to the semiconductor chip 11 at the top of the optoelectronic semiconductor component 1 by the contact element 15, which is in the form of, e.g. a metal layer. On the bottom of the optoelectronic semiconductor component 1, at a distance laterally from the electrical connection point 13A, the further electrical connection point 13B is arranged, which can be formed identically to the first electrical connection point 13A. The further electrical connection point 13B is in direct contact with the via and the adjacent molded body 12, for example. The electrical connection point 13A and the further electrical connection point 13B can be designed as stated above. Both electrical connection points 13A and 13B are mechanically and electrically connected by a connecting material 2, e.g. a solder paste, to the connection carrier 3, e.g. a printed circuit board, and so the optoelectronic semiconductor component 1 is surface-mounted on the connection carrier 3.

In contrast to the example of FIG. 1, the electrical connection point 13a in the example of FIG. 2 does not extend on the bottom of the molded body 12 but is only formed in the area of the semiconductor chip 11, wherein it can also completely cover the bottom thereof, unlike the illustration. However, it is also possible in the example of FIG. 2 that the electrical connection point 13a extends over both the semiconductor chip 11 on the bottom thereof and the molded body 12.

Overall, the illustrated optoelectronic semiconductor components 1 can be produced by our method, wherein the electrical connection point 13A and optionally the further electrical connection point 13B are each produced by a PVD method.

The description with the aid of the examples does not limit this disclosure thereto. Rather, this disclosure comprises any new feature and any combination of features, which in particular includes any combination of features in the appended claims, even if the feature or combination is not itself explicitly stated in the claims or examples.

The priority of DE 102015101070.4 is claimed, the subject matter of which is incorporated herein by reference.

The invention claimed is:

1. An optoelectronic semiconductor component comprising:
   an optoelectronic semiconductor chip; and
   an electrical connection point that contacts the optoelectronic semiconductor chip, wherein
   the electrical connection point covers portions of a bottom surface of the optoelectronic semiconductor chip,
   the electrical connection point comprises a contact layer facing toward the optoelectronic semiconductor chip,
   the electrical connection point comprises barrier layers arranged on a side of the contact layer facing away from the optoelectronic semiconductor chip,
   the electrical connection point comprises a protective layer arranged on a side of the barrier layers facing away from the contact layer,
   the contact layer, the barrier layers and the protective layer of the electrical connection point are arranged one on top of another along a stack direction,
   the stack direction runs perpendicular to a main extension plane of the optoelectronic semiconductor chip,
   the electrical connection point comprises a stack of the barrier layers and intermediate layers, each intermediate layer in the stack is arranged directly between two barrier layers, the stack is arranged between the contact layer and the protective layer, and the stack is compressively strained.

2. The optoelectronic semiconductor component according to claim 1, wherein the barrier layers or the electrical connection point are produced exclusively by physical vapor deposition.

3. The optoelectronic semiconductor component according to claim 1, further comprising a molded body formed using an electrically insulating material and laterally surround portions of the optoelectronic semiconductor chip, wherein the electrical connection point covers portions of a bottom surface of the molded body.

4. The optoelectronic semiconductor component according to claim 3, wherein the electrical connection point extends without interruption from an area covering the optoelectronic semiconductor chip to an area covering the molded body.

5. The optoelectronic semiconductor component according to claim 1, wherein portions of the electrical connection point are in direct contact with the optoelectronic semiconductor chip and/or the molded body.

6. The optoelectronic semiconductor component according to claim 1, wherein the electrical connection point has two or more pairs of the barrier layers and an intermediate layer that border one another directly and are arranged between the contact layer and the protective layer stacked one on top of another.

7. The optoelectronic semiconductor component according to claim 1, wherein the electrical connection point has a thickness 250 nm to 2000 nm.

8. The optoelectronic semiconductor component according to claim 1, further comprising a further electrical connection point formed identically to the electrical connection point that contacts the optoelectronic semiconductor chip.

9. The optoelectronic semiconductor component according to claim 3, further comprising a via, wherein portions of the via extend through the molded body, wherein portions of a further electrical connection point cover the via.

10. The optoelectronic semiconductor component according to claim 9, wherein portions of the further electrical connection point are in direct contact with the via and/or the molded body.

11. An optoelectronic arrangement comprising:
    a connection carrier; and
    at least one optoelectronic semiconductor component according to claim 1, wherein
    between the connection carrier and the optoelectronic semiconductor component a connecting material is arranged, and the connecting material is in direct contact with the protective layer.

12. A method of producing the optoelectronic semiconductor component according to claim 1, comprising producing the electrical connection point exclusively by physical vapor deposition.

13. The method according to claim 12, wherein the further electrical connection point is produced exclusively by physical vapor deposition.

\* \* \* \* \*